United States Patent [19]

Buchmann et al.

[11] Patent Number: 5,287,001
[45] Date of Patent: Feb. 15, 1994

[54] COOLING STRUCTURES AND PACKAGE MODULES FOR SEMICONDUCTORS

[75] Inventors: Peter Buchmann, Langnau am Albis, Switzerland; Peter Unger, Thalwil, Fed. Rep. of Germany; Peter Vettiger, Langnau am Albis, Switzerland; Otto Voegeli, Morgan Hill, Calif.

[73] Assignee: International Business Machines Corporation, Armonk, N.Y.

[21] Appl. No.: 874,246

[22] Filed: Apr. 24, 1992

[30] Foreign Application Priority Data

May 3, 1991 [EP] European Pat. Off. ........ 91810342.5

[51] Int. Cl.$^5$ ............................................. H01L 23/02
[52] U.S. Cl. ...................... 257/719; 257/712; 257/717; 361/704; 361/714; 165/80.2; 165/185
[58] Field of Search ............... 257/712, 713, 717, 718, 257/719; 361/386, 389; 165/80.2, 80.3, 185

[56] References Cited

U.S. PATENT DOCUMENTS

| | | | |
|---|---|---|---|
| 3,896,544 | 7/1975 | Fosnough | 257/719 |
| 4,479,140 | 10/1984 | Horvath | 357/81 |
| 4,827,376 | 5/1989 | Voss | 361/388 |
| 4,829,403 | 5/1989 | Harding | 361/386 |

FOREIGN PATENT DOCUMENTS

| | | |
|---|---|---|
| 56-065903 | 4/1981 | Japan . |
| 58-124455 | 7/1983 | Japan . |
| 62-0229524 | 9/1987 | Japan . |
| 62-018895 | 8/1988 | Japan . |
| 62-085940 | 10/1988 | Japan . |

OTHER PUBLICATIONS

IBM Technical Disclosure Bulletin, vol. 20, No. 5, p. 1768, Oct. 1977, E. E. Zirnis, "Semiconductor Module with Improved Air Cooling."
IBM Technical Disclosure Bulletin, vol. 20, No. 8, p. 3223, Jan. 1978, O. R. Gupta, "Chip/Can Conduction Path."
IBM Technical Disclosure Bulletin, vol. 27, No. 7B, pp. 4413–4415, Dec. 1984, W. C. Yeh, "Bump Internal–Thermal Enhancement".
"Microelectronics Packaging Handbook", copyright 1989 Van Nostrand Reinhold, pp. 48 ∝ 49 and 338, R. R. Tummala and E. J. Rymaszewski.

*Primary Examiner*—Rolf Hille
*Assistant Examiner*—David Ostrowski
*Attorney, Agent, or Firm*—Aziz M. Ahsan

[57] ABSTRACT

Cooling structure for direct heat transfer between an active layer of a chip in which electric elements are formed and a heat sink are disclosed. The inventive cooling structure consists of a current/voltage supply level, with metal structures and insulation spacers and/or layers, partly covered by an insulation layer and followed by a heat transfer structure. A heat transfer bridge is in thermal connection with the heat transfer structure that provides for heat flux between the inventive cooling structure and the heat sink. The inventive cooling structure of this invention can be used with semiconductor devices and/or with opto-electronic devices.

24 Claims, 7 Drawing Sheets

COOLING STRUCTURES AND PACKAGE MODULES FOR SEMICONDUCTORS

FIELD OF THE INVENTION

The present invention relates to cooling structures for semiconductor devices and for opto-electronic devices. The cooling structures are formed on top of the active surface where the heat developing elements are situated such that the heat flows from the active surface through the inventive cooling structures directly to a heat sink.

BACKGROUND OF THE INVENTION

Today a major barrier to full realization of the advantages offered by widely used highly integrated circuits is the packaging technology. Connecting, cooling, and housing of circuits is referred to as packaging. The integration density of electronic and opto-electronic circuits is growing very fast. Today the integration of thousands of transistors, capacitors, resistors, and other elements on one chip is possible. There is a similar integration trend in the area of opto-electronic devices.

With increasing integration density, the heating of integrated circuits becomes more and more a problem. The power density and therewith the heating of these circuits increases. The performance of electronic and opto-electronic elements is affected by the temperature to such a degree that stable temperatures become of fundamental importance for reliable operation. Overheating of semiconductors and semiconductor devices as well, leads to destruction of the same. The fact that the circuit density is rising faster than the power consumed by the individual circuits can be reduced, requires increasing care in the dissipation of thermal energy, and homogeneous and effective cooling of integrated circuits becomes more important.

Basically, two different methods for the cooling of integrated circuits are known in the art. The first one, known as thermal conduction, is based on the physical principle (following thermodynamic concepts), that heat flows along a thermal gradient, from one part of a body at a higher temperature, to another part of a body at a lower temperature. The second method for removing heat from a heat source uses convection, where the heat is transferred from the source to a cooling fluid which passes the heat source. Fluid cooling systems are very bulky and the motor-driven pumps which are necessary for the circulation of the fluid are susceptible to trouble and may cause electro-magnetic disturbances.

More reliable, smaller, and simpler cooling structures are based on the first mentioned thermal conduction. Different cooling structures, based on the principle of conduction, are known in the art. FIG. 1 shows a cross section of a prior art chip package module wherein a semiconductor chip 10, with an active layer 11, is secured to a substrate 12. The electronic elements situated in the active layer 11, are electrically connected via bond wires 15, to pins 14. The chip 10, mounted on substrate 12, is protected by a heat sink metal cap 13, which is secured to the substrate 12. The heat developed by the electronic elements in the active layer 11, flows through the chip 10, and the substrate 12, to the metal cap 13, as illustrated by the heat flux arrows 16. As illustrated in FIG. 1, the chip 10, is mounted such that the active layer 11, is oriented upward and the heat developed in the active layer has to flow through the chip 10, and substrate 12, to the heat sink 13.

Another cooling structure of the prior art is shown in FIG. 2. A semiconductor chip 20, with active layer 21, is mounted on solder balls 24, such that the active layer 21, is oriented downwards. The electronic elements of the active layer 21, are electronically connected via conductive lines 23, and conductive structures 22, such as vias, to metal pins 14. The conductive structures 22, are situated on a single or multilayer substrate 25, which is secured to a metal cap 13. The substrate 25, can be formed of inorganic resins, ceramic, or any suitable dielectric material. The upper part of the module of FIG. 2, includes a flexible thermal bridge 26, extending between the cap 13, and the backside surface of the chip 20. The heat flux 16, passes through the chip 20, and the thermal bridge 26, to the cap 13. In this structure, the active layer 21, is, in contrast to the arrangement of FIG. 1, oriented downward but the heat, nevertheless, has to flow from said active layer 21, through the chip 20, and then via a thermal bridge 26 to the heat sink metal cap 13.

These cooling structures, illustrated in FIG. 1 and FIG. 2, are in principle described, for example on pages 48, 49 and 338, in "Microelectronics Packaging Handbook", edited by R. R. Tummala and E. J. Rymaszewski, publisher Van Nostrand Reinhold (1989), and in the article "Semiconductor Module With Improved Air Cooling", IBM Technical Disclosure Bulletin, Vol. 20, No. 5, page 1768 (October 1977), respectively, and the disclosures of which are incorporated herein by reference.

A great number of similar cooling structures based on the above described principles are known in the art, as there are for example, the European Patent EP 97782, which corresponds to U.S. Pat. No. 4,479,140, entitled "Thermal Conduction Element For Conducting Heat From Semiconductor Devices To A Cold Plate", the article "Bump Internal-Thermal Enhancement", IBM Technical Disclosure Bulletin, Vol. 27, No. 7B, pp. 4413–4415, (December 1984), and the article "Chip/-Can Conduction Path", IBM Technical Disclosure Bulletin, Vol. 20, No. 8, page 3223 (January 1978). The disclosure of all of these references is incorporated herein by reference.

It is known in the art that lasers with high power can be cooled by mounting them junction-side-down and soldering them onto a heat sink, e.g. a metal cooling structure. The active elements are directly thermally coupled to the heat sink. Disadvantages of this packaging method are that the heat sink has to be structured and this is time consuming and expensive alignments become necessary. A further disadvantage of this type of mounting is, that junction-side-down mounting is not possible if optical input/output ports are required.

One main disadvantage of all the above described and other structures known to the applicant is, that the heat has to flow from the heat sources through the chip from where it is eliminated via a substrate or a thermal bridge (with the exception of the above described junction-side-down mounted lasers). The thermal resistance between the heat developing elements in the active layer and the heat sink is substantial, mainly caused by the thickness of the chip and its poor thermal conductivity, resulting in overheating and reduced reliability of these chips.

OBJECTS AND SUMMARY OF THE INVENTION

It is one object of the present invention to provide a cooling structure for direct heat transfer between the active layer of an electronic or opto-electronic chip and a heat sink.

Another object of the present invention is to provide a cooling structure on top of a chip which reduces packaging problems.

Still another object of this invention is to provide a cooling structure for opto-electronic devices or chips with optical input/output ports arranged such that junction-up mounting of the devices or chips is possible.

A further object of the present invention is to provide a cooling structure which can be used for the cooling of single heat developing elements, such as lasers, diodes, transistors, to name a few.

Yet another object of the present invention is to provide a complete packaging module for electronic or opto-electronic chips including the inventive cooling structure.

In the inventive cooling structure this is accomplished in that the inventive structure is directly formed on top of the active layer. The inventive structure includes a current/voltage supply level, an insulation layer, and a heat transfer structure arranged such that the heat developed in the active layer flows directly through the cooling structure to a heat sink. The cooling structure itself can work partially as electrical conductor level.

One advantage offered by the inventive cooling structure is, that it has only a very small thermal resistance such that effective cooling of chips and devices is possible. In addition, selective cooling of strong heat sources is possible, thus resulting in a homogeneous overall temperature in the active layer and the substrate below.

Another advantage is, that mutual thermal coupling between neighboring electrical elements is reduced and their operation becomes more reliable. If additional thermal separation of single elements is required, the inventive cooling structure allows an integration of heat barriers. If on the other hand thermal coupling between individual elements is desired, the invention allows the integration of special heat bridges.

A further advantage of the present invention is, that junction-up mounted opto-electronic chips or devices (e.g. surface emitting lasers) can easily be connected to external optical fibers, lenses or mirrors. Packaging of LSLI (Large Scale Laser Integration) chips having surface-emitting input-output ports within the chip area is possible.

Another advantage is that single electronic or opto-electronic elements can be cooled without external heat sink by using the heat transfer structure as heat sink.

The invention as claimed is intended to meet these objectives and advantages, either alone or in combination, and to remedy one aspect of known deficiencies of cooling structures and semiconductor packages.

In one aspect the invention is a cooling structure for direct heat transfer between at least one electronic element formed in an active layer of a semiconductor chip and at least one heat sink comprising:

a) a current/voltage supply level formed on said active layer, said current/voltage supply level having at least one electrical current conductor as power supply line and/or signal line for said at least one electronic element, and further comprising at least one insulation spacer and/or layer electrically isolating said at least one electrical current conductor, b) an insulation layer covering at least a portion of said current/voltage supply level, c) means for heat transfer formed on top of at least a portion of said insulation layer and on at least a portion of exposed upper portions of said current-/voltage supply level, said means for heat transfer thermally connecting to at least a portion of said current/voltage supply level and providing at least one thermal contact area, and d) at least one thermal bridge forming a thermal connection between said at least one thermal contact area and said at least one heat sink, wherein said current/voltage supply level, said insulation layer, said means for heat transfer, and said thermal bridge are arranged such that a low thermal resistance path is provided for directly transferring the heat developed in said at least one electronic elements via said at least one thermal bridge to said at least one heat sink.

In another aspect the invention is a chip package module for electronic or opto-electronic devices, comprising of a substrate, on which at least one semiconductor chip is mounted, and a metal cap used as heat sink, further comprising:

a) a cooling structure formed on top of said at least one semiconductor chip, b) said cooling structure comprising of a current-/voltage supply level formed on an active layer of said semiconductor chip, said current/voltage supply level comprising of at least one electrical current conductor as power supply line and/or signal line for at least one electric element, and further comprising at least one insulation spacer and/or layer electrically isolating said at least one electrical current conductor, c) an insulation layer covering at least a portion of said current/voltage supply level, d) means for heat transfer formed on top of at least a portion of said insulation layer and on at least a portion of exposed upper portions of said current-/voltage supply level, said means for heat transfer thermally connecting to at least a portion of said current/voltage supply level and providing at least one thermal contact area, and e) at least one thermal bridge forming a thermal connection between said at least one thermal contact area and said at least one heat sink, wherein said current/voltage supply level, said insulation layer, said means for heat transfer, and said thermal bridge are arranged such that a low thermal resistance path is provided for directly transferring the heat developed in said at least one electronic elements via said at least one thermal bridge to said at least one heat sink.

In yet another aspect the invention is a process for providing a cooling structure for directly cooling an active layer of a semiconductor chip comprising the steps of:

(a) forming a current/voltage supply level over at least a portion of said active layer of said semiconductor chip, (b) forming an insulator layer over at least a portion of said current/voltage supply level, (c) forming a heat transfer structure over at least a portion of said insulator layer and any exposed portions of said current/voltage supply level,
(d) forming a thermal contact area on at least a portion of said heat transfer structure, and
(e) forming a thermal bridge between said thermal contact area and a heat sink, such that heat is directly transferred from said active layer to said heat sink, thereby providing said direct cooling of said active layer of a semiconductor chip.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

The present invention is depicted in FIGS. 1-10, in which like numerals refer to like features of the invention, but in which features are not necessarily drawn to scale.

In the following paragraphs the present invention is described at length. More detailed information is given in context with the different embodiments each of them utilizing a special configuration of the inventive cooling structure.

Figure 1:
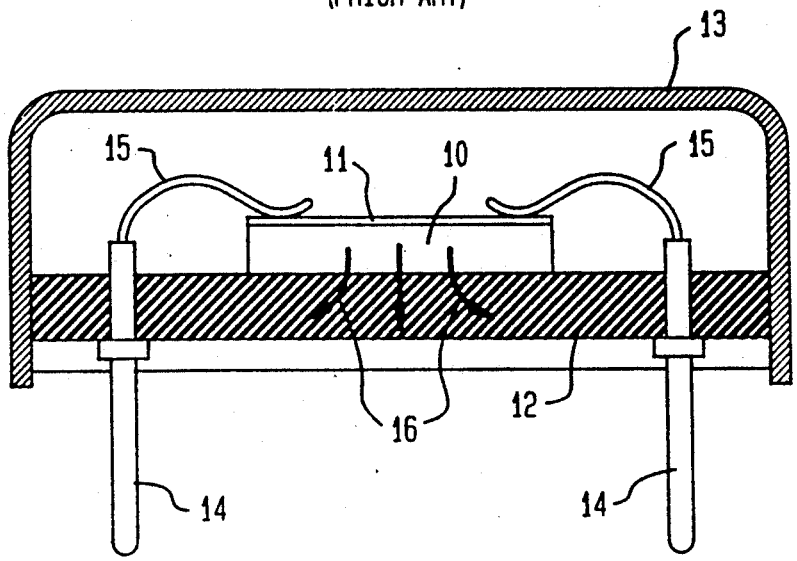
FIG. 1 is a schematic cross-section of a prior art chip package module.
Figure 2:
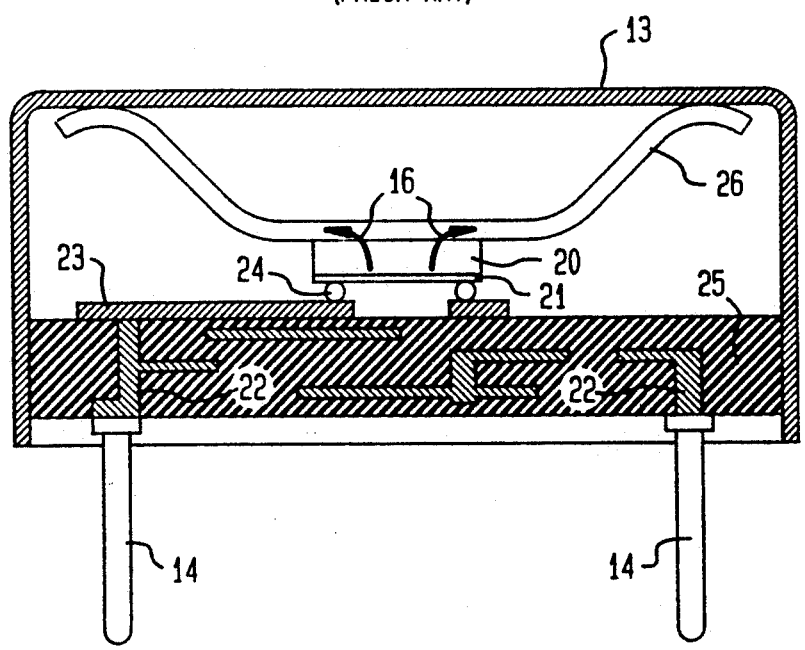
FIG. 2, is a schematic cross-section of another prior art chip package module.
Figure 3:
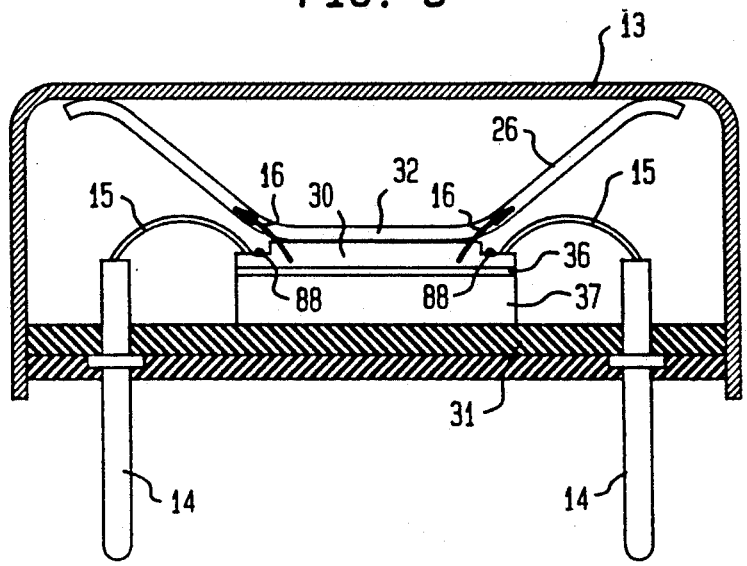
FIG. 3, is a schematic cross-section of the inventive chip package module, used to illustrate the principle of the invention.

FIG. 3 shows a schematic cross-section of a structure used to describe the concept of the invention. As illustrated, the inventive cooling structure 30, is formed on top of a chip 37, with active layer 36, which is mounted on a chip mounting pad or substrate 31. This substrate 31, is secured to a metal cap 13. The inventive cooling structure 30, arranged on top of the active layer 36, with the heat developing electrical elements, has electric contact areas, e.g. with bonding pads 88, used as electrical input/output ports, and a planar upper surface 32, hereinafter referred to as the thermal contact area 32. The module includes a heat transfer bridge 26, thermally connected to the thermal contact area 32, and the metal cap 13, used as heat sink. As illustrated in FIG. 3, the chip 37, is connected via bond wires 15, to pins 14, which, in the described module, are fixed in the substrate 31.

Figure 4:
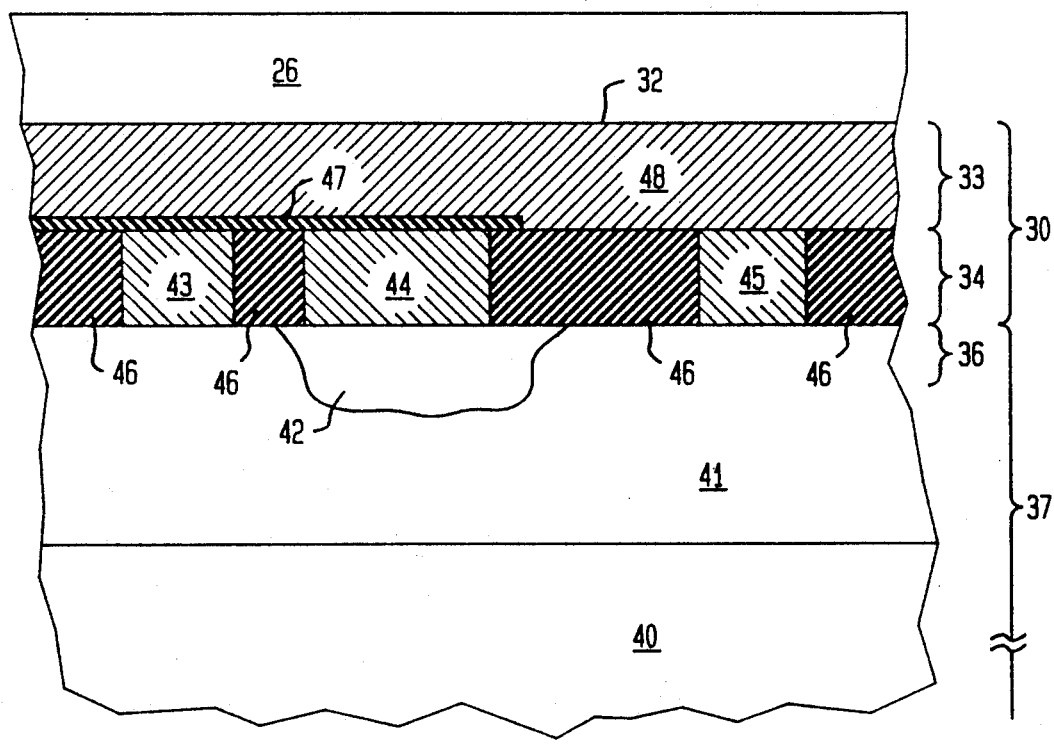
FIG. 4, is a more detailed illustration of the inventive cooling structure of the module shown in FIG. 3.

The heat developed from electrical elements in the active layer 36, flows directly from these heat sources through the inventive cooling structure 30, and the thermal bridge 26. The cooling structure is, in reality, very thin in comparison with the chip 37, and has a smaller thermal resistance because it consists mainly of metal structures. A detailed sketch of the device of FIG. 3 is illustrated in FIG. 4. This sketch shows a cross-section of a MESFET (metal-semiconductor field-effect transistor) formed on a p-type or semi-insulating chip substrate 40, and an n-doped layer 41, having a gate region 42, and gate contact 44, source contact 43, and drain contact 45. These metal contacts 43, 44, and 45, being parts of the inventive cooling structure 30, are separated by insulation spacers 46. Contacts and spacers form together a fairly planar surface. This lower part of the inventive cooling structure 30, is referred to as current/voltage (c/v) supply level 34. A heat transfer level 33, comprising of an insulation layer 47, partly covering the c/v supply level 34, and a heat transfer structure 48, as illustrated in FIG. 4, is formed on top of the c/v supply level 34. If the heat transfer structure 48, is a metal layer, it can be used for electrically interconnecting parts of the c/v supply level 34 as shown in FIG. 4, where heat transfer structure 48 is connected to the drain contact 45. Contacts 43, 44 are electrically connected to bonding pads not visible in this cross-section. The heat developed in the active layer 36, of the MESFET flows through the c/v supply level 34, and the heat transfer level 33, to the thermal transfer bridge 26, which is thermally coupled to a heat sink at one side and to the thermal contact area 32 of the heat transfer structure 48 at the other side. The chip substrate 40, and the n-doped layer 41, having the active layer 36, comprise the chip 37. Similarly, the inventive cooling structure 30, comprises of the heat transfer level 33, and the c/v supply level 34.

Depending on the chip or device which has to be cooled, different configurations of the inventive cooling structure 30, are possible. The c/v supply level 34, becomes more and more complex with increasing integration density of electrical elements each of them requiring electrical input/output ports. These highly integrated chips require c/v supply levels 34, comprising of different metallization layers separated by insulation spacers and layers. Different forms of heat transfer bridges 26, are known in the art such as pistons, stamps, metal foils, thermal grease, springs and so on, which can be used as thermal couplers between the heat transfer structure and a heat sink. It is conceivable that an external heat sink is not necessary for the cooling of single electronic or opto-electronic elements if the heat transfer structure is formed such that it can be used as heat sink.

Typical fabrication processes of the inventive cooling structures are described in context with the different embodiments.

Figure 5:
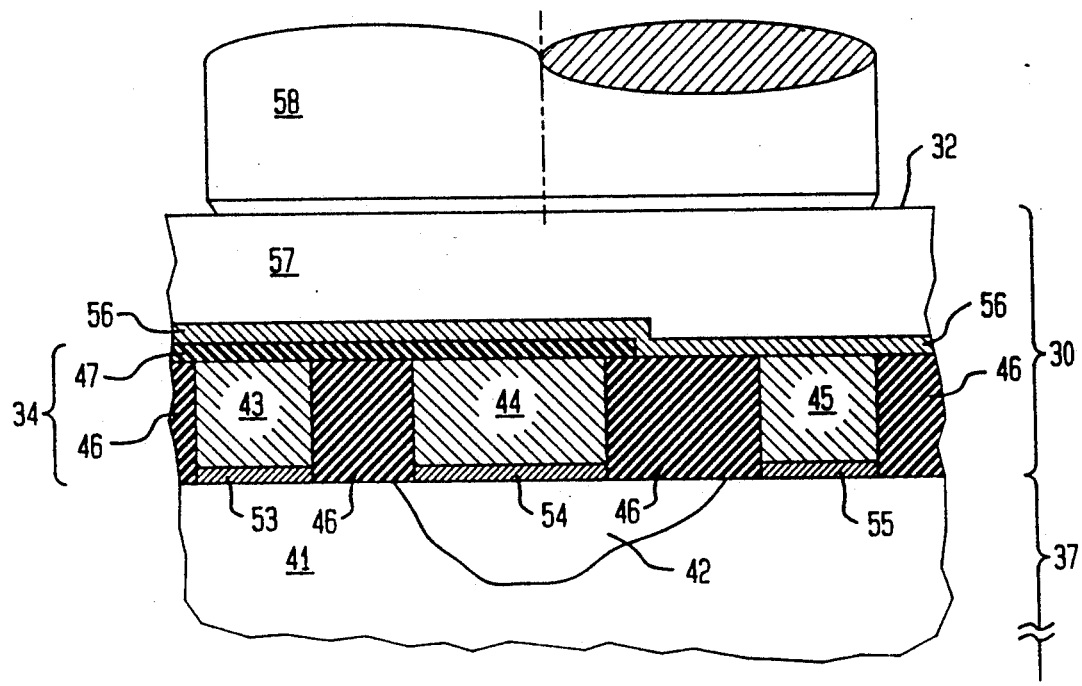
FIG. 5 is a schematic cross-sectional sketch of a MESFET incorporating a first embodiment of the inventive cooling structure.

A first embodiment of the present invention is a cooling structure for a semiconductor chip. It is similar to the cooling structure described in context with FIG. 3 and FIG. 4. A sketch of the first embodiment is shown in FIG. 5. As in FIG. 4, only one MESFET, out of a large number of electrical elements, is illustrated. The MESFET is grown on top of a GaAs wafer and the gate region 42, is formed in an n-doped GaAs layer 41. The source contact 43, gate contact 44, and drain contact 45, are formed on plating bases 53, 54 and 55, respectively, by a process, such as an electro-plating process. The contacts 43, 44 and 45, and the plating bases 53, 54 and 55, are separated by insulation spacers 46. The upper surface of the c/v supply level 34, now comprises of the contacts 43, 44 and 45, plating bases 53, 54 and 55, and insulation spacers 46, is partly covered by an insulation layer 47, to prevent short circuits between the contacts and the heat transfer structure 57. The covered and uncovered parts of the c/v supply level 34, are covered with another plating base 56, on which the heat transfer structure 57, is electro-plated. The heat transferred from the MESFET via the c/v supply level 34, and the insulation layer 47, to the heat transfer structure 57, is removed from the upper surface or thermal contact area 32, of the inventive cooling structure 30, via a secondary cooling structure, such as a small metal piston 58.

Following is a brief description of the fabrication process of cooling structures similar to the cooling structure 30, described in context with the first embodiment. The source, gate, and drain metallization of the MESFET also serves as a plating base 53, 54 and 55. Therefore the metallization should have a noble metal on top (e.g. gold). Next, a mold or insulation spacers 46, e.g. consisting of polymeric material, for an electro-plating process are fabricated. The mold 46, may consist of a photoresist, which has been patterned by optical, x-ray, or e-beam lithography, or of a tri-level resist system. For the electro-plating process, the plating bases 53, 54 and 55, have to be connected to one pole of a voltage source, and the chip 37, is placed in a electrolytic bath with an electrode connected to the second pole of the source. After these preparations, the patterned mold 46, is filled with metal from the electrolytic bath by electro-deposition, forming the metal structures 43, 44 and 45. For further processing, the mold 46, can be left on the chip 37, as shown in this example. The current/voltage supply level 34, is ready and is subsequently covered by a contiguous insulation layer 47, in the next step. To provide proper heat conduction, this could be a thin dielectric like beryllia (BO) or aluminia ($Al_2O_3$). Using a photolithographic mask followed by an etching process, the insulation layer 47, is removed on parts of the c/v supply level 34, where an electric conduction is needed between heat transfer structure 57, and c/v supply level 34. Then another plating base 56, (e.g. 10 nm Cr, 100 nm Au) is evaporated on the surface. This plating base 56, is patterned using a photoresist mask and a lift-off process to leave bond pads open (not visible in FIG. 5). Next, another mold (not shown) is fabricated, which is made of a polymeric material. This mold may be several tenths of micrometer thick and may consist of a photoresist as described above. After this step, the heat transfer structure 57, is electro-plated in this mold. For the electro-plating step a commercially available solution is used, such that a metal with good heat conduction like gold is deposited. The mold can be left on the chip or removed using an oxygen plasma.

The electro-galvanic stiffening of the metallization reduces its electrical resistance. If the resistance of the metallization is not critical, the cooling structure can be formed directly on top of the contact metallization 53, 54 and 55. The spacers 46, can be removed, as long as, the gaps between the metal structures 43, 44 and 45, and the plating bases 53, 54 and 55, serve as insulating spacers.

Figure 6:
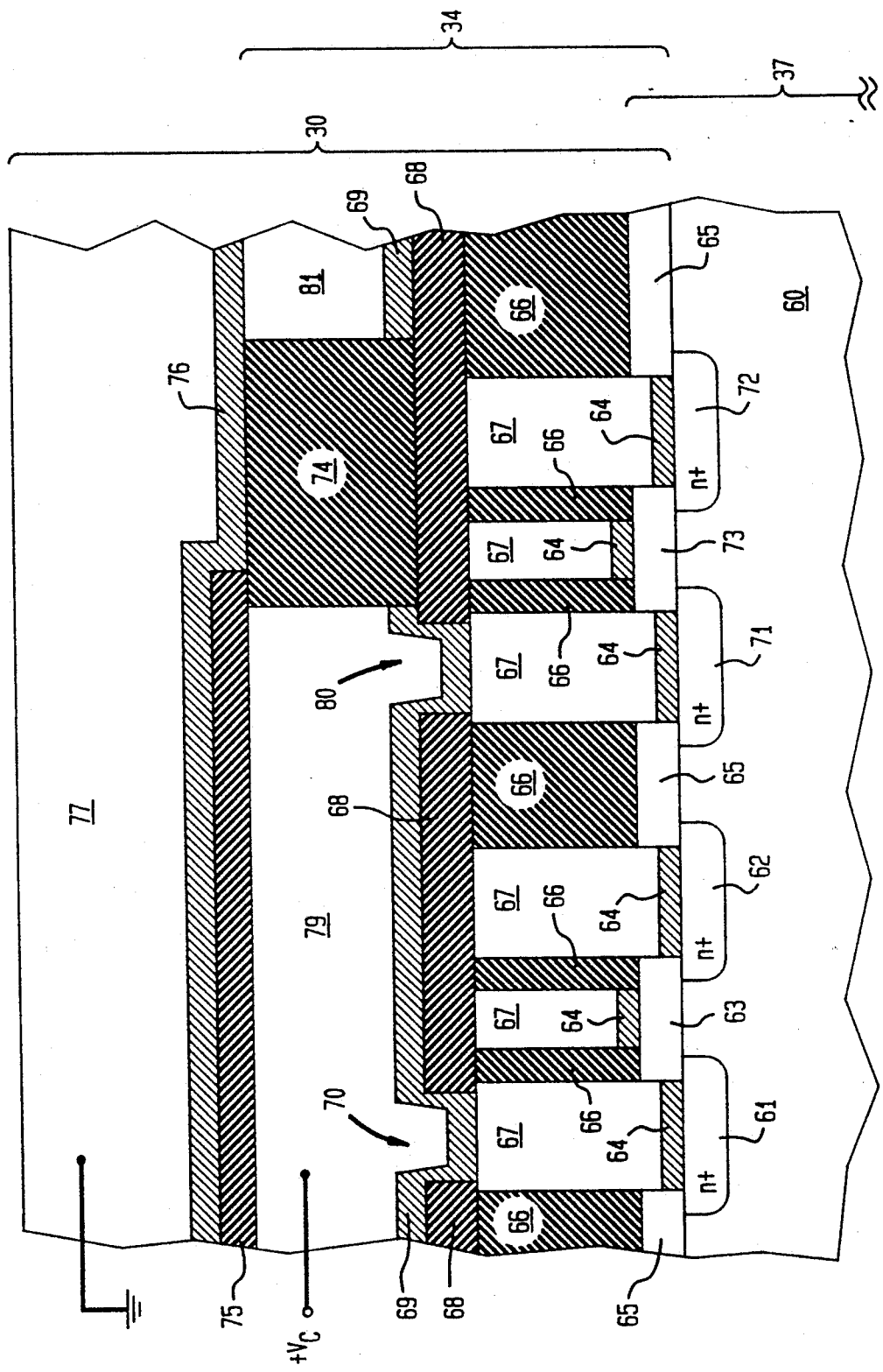
FIG. 6 is a schematic cross-sectional sketch of a MOSFET incorporating a second embodiment of the inventive cooling structure.

A second embodiment of the present invention is a cooling structure 30, of a semiconductor chip 37, with a plurality of integrated electrical elements. It is illustrated in FIG. 6. The cross-section shows two MOSFET's (metal-oxide field-effect transistor), each of them having an $n^+$-doped source region (61, 71), and an $n^+$-doped drain region (62, 72) extending down into a p-doped substrate 60. The chip 37, is partly covered with $SiO_2$-layer 65. Parts of this layer 65, form the gate oxides 63 and 73. The gate, source, and drain regions are electrically connected to plating bases 64, and electro-plated metal structures 67, separated against each other by insulation spacers 66. The upper surface of this first part of the c/v supply level 34, is partly covered by an insulation layer 68, which has two contact windows 70 and 80. This insulation layer 68, is partly covered by another plating base 69. A second part of the c/v supply level 34, comprises, of metal structures 79, 81, and insulation spacers 74, is formed on top of the plating base 69, and insulation layer 68. The metal structure 71, connects the source regions 61 and 71, of both transistors to the positive voltage source $+V_c$. The upper surface of the second c/v supply level 34, is covered by another combination of an insulation layer 75, and plating base 76, on which the heat transfer structure 77 is formed. In this embodiment structure 77, is connected to ground. In addition, the heat transfer structure 77, and plating base 76, form a shielding. The electro-plating process is advantageous to the above described cooling structures because of its high aspect ratio (thickness/width).

The fabrication process of the cooling structure as described above is similar to fabrication process of the first embodiment. The main difference is that there is not only one level with metal structures but several metal levels partly electrically connected and arranged such, that the c/v supply level 34, provides the electrical connection to the individual elements of the chip 37, (e.g. two MOSFET's).

Therefore, the photolithographic and electro-plating steps have to be adapted to this special configuration. After the evaporation of the insulating layer 68, it can be structured by etching the contact windows 70, 80, as illustrated in FIG. 6. Electrically interconnecting parts of the metal structures 67 and 79, in this embodiment, is possible by using the metal structures of the next level.

The oxides 65 and 63, 73, can be used as insulation spacers for the metal structures as well. The gate oxides 63, 73, can be formed by a thermal oxidation process, and the thicker oxides 65, can be formed by a conventionally used oxidation step.

Figure 7:
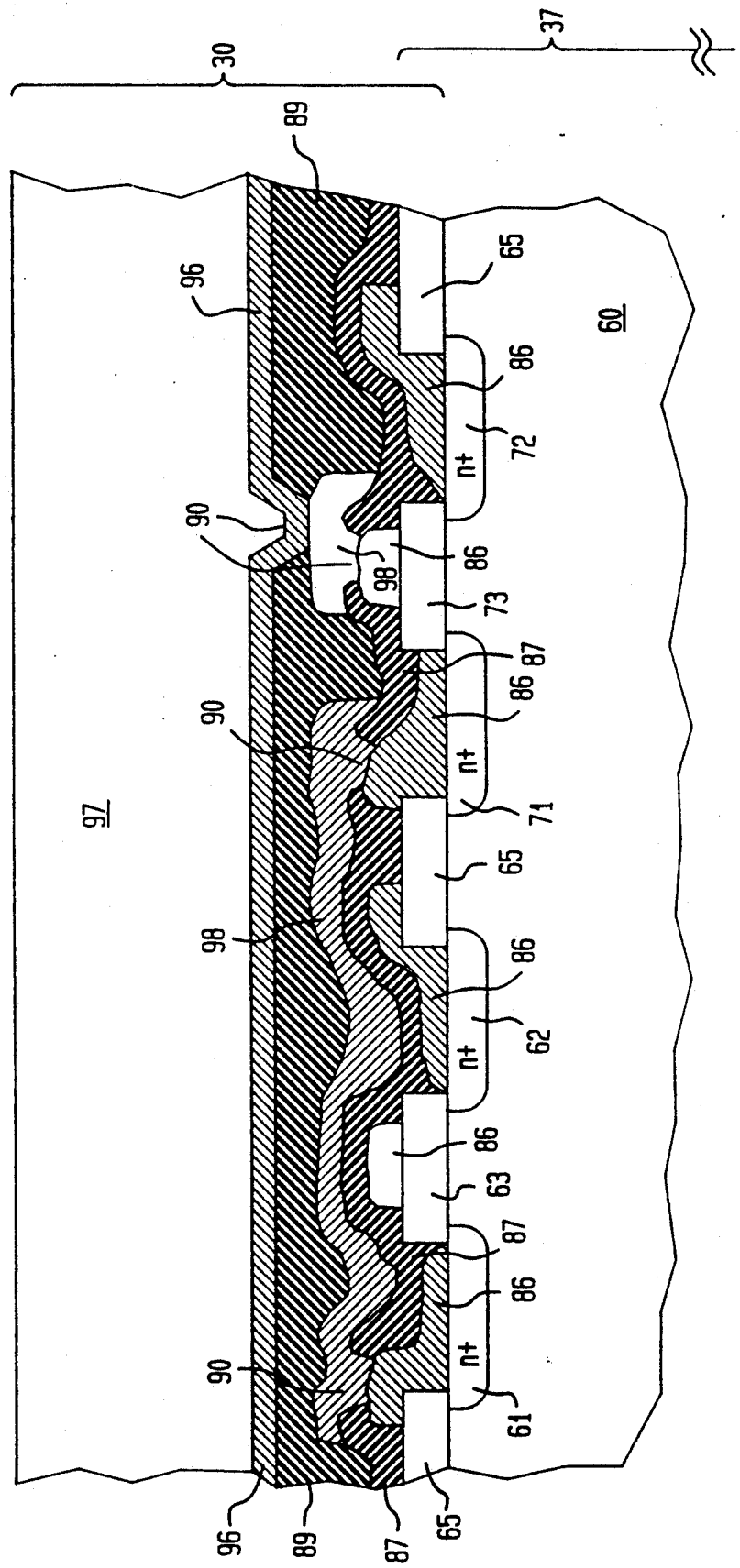
FIG. 7, is a schematic cross-sectional sketch of a MOSFET incorporating a third embodiment of the inventive cooling structure.

A third embodiment of the present invention is a cooling structure 30, of a chip 37, on which several elements are integrated. FIG. 7 shows a schematic cross-sectional sketch of two MOSFET's similar to the MOSFET's described in context with FIG. 6. The source regions 61 and 71, the gate oxide layers 63 and 73, and the drain regions 62 and 72, are partly covered by deposited metal layers 86. These metal layers 86, are in parts covered by a structured insulation layer 87, e.g. polyimide or quartz. The second conductor layer 98, covers parts of the insulation layer 87. A further structured insulation layer 89, followed by a plating base 96, and a heat transfer structure 97, are formed on top of the second conductor layers 98, and the insulation layers 87. Parts of the metal layers are electrically interconnected via contact holes 90. In this example, the gate oxide 73, is connected to the heat transfer structure 97, via metallization 86, second conductor layer 98, and plating base 96.

Figure 8:
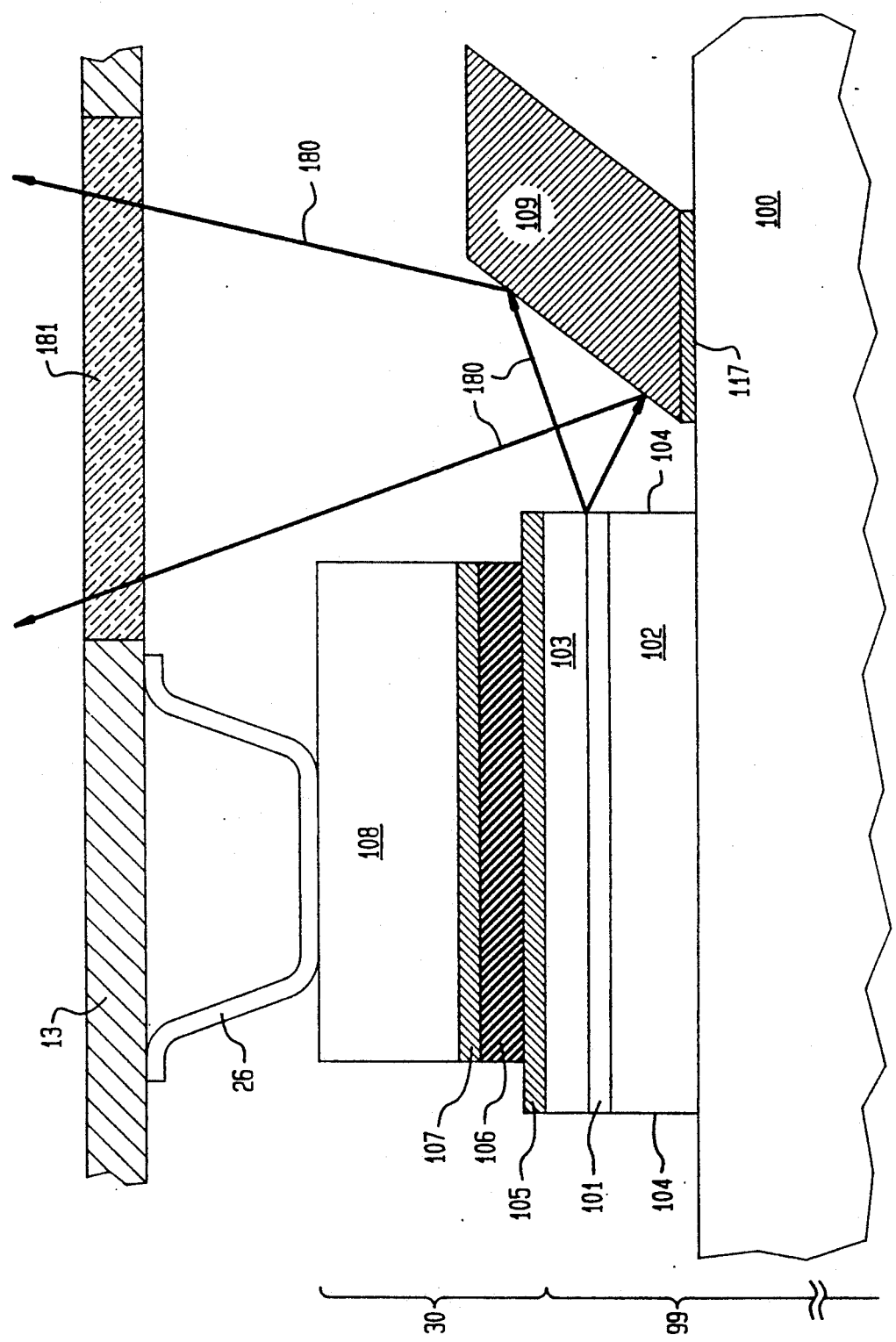
FIG. 8 is a schematic cross-section of a diode laser with 45° mirror incorporating a fourth embodiment of the inventive cooling structure.

A fourth embodiment of the present invention is described in context with FIG. 8. A cross-section of a single laser device 99, grown on an n+-GaAs substrate 100, is illustrated in this figure. The active layer 101, is embedded between n-doped and p-doped AlGaAs cladding layers 102 and 103, respectively, and limited by vertical etched laser facets 104. A current conductor 105, is deposited on top of layer 102, and is covered by an insulation layer 106. The current conductor 105, is electrically isolated from plating base 107, heat transfer structure 108, formed on top of the insulation layer 106, heat bridge 26, and metal cap 13. The heat transfer structure 108, grown on the plating base 107, is employed for heat removal from the active layer 101. The heat flows from the active layer through the cooling structure and the heat bridge 26, to a metal cap 13. The cap 13, has a transparent section 181, e.g. a lens, used as optical output port for laser beams 180, emitted by the laser and reflected by a 45° metal mirror 109. The mirror 109, is electro-plated on a plating base 117.

The fourth embodiment is an important improvement in laser chip cooling and packaging. The conventional way of packaging diode lasers is to mount them junction up on a heat sink, such that the heat developed at the active layer has to flow through the thick substrate of the laser. The fourth embodiment of the invention represents a cooling structure 30, and packaging module which allows junction up mounting of a laser 99, and effective and homogeneous upwards heat transfer via the cooling structure 30. Metal mirrors 109, with different inclination and orientation can be employed and the cooling of laser arrays and opto-electronic circuits using similar cooling structures is possible.

Figure 9:
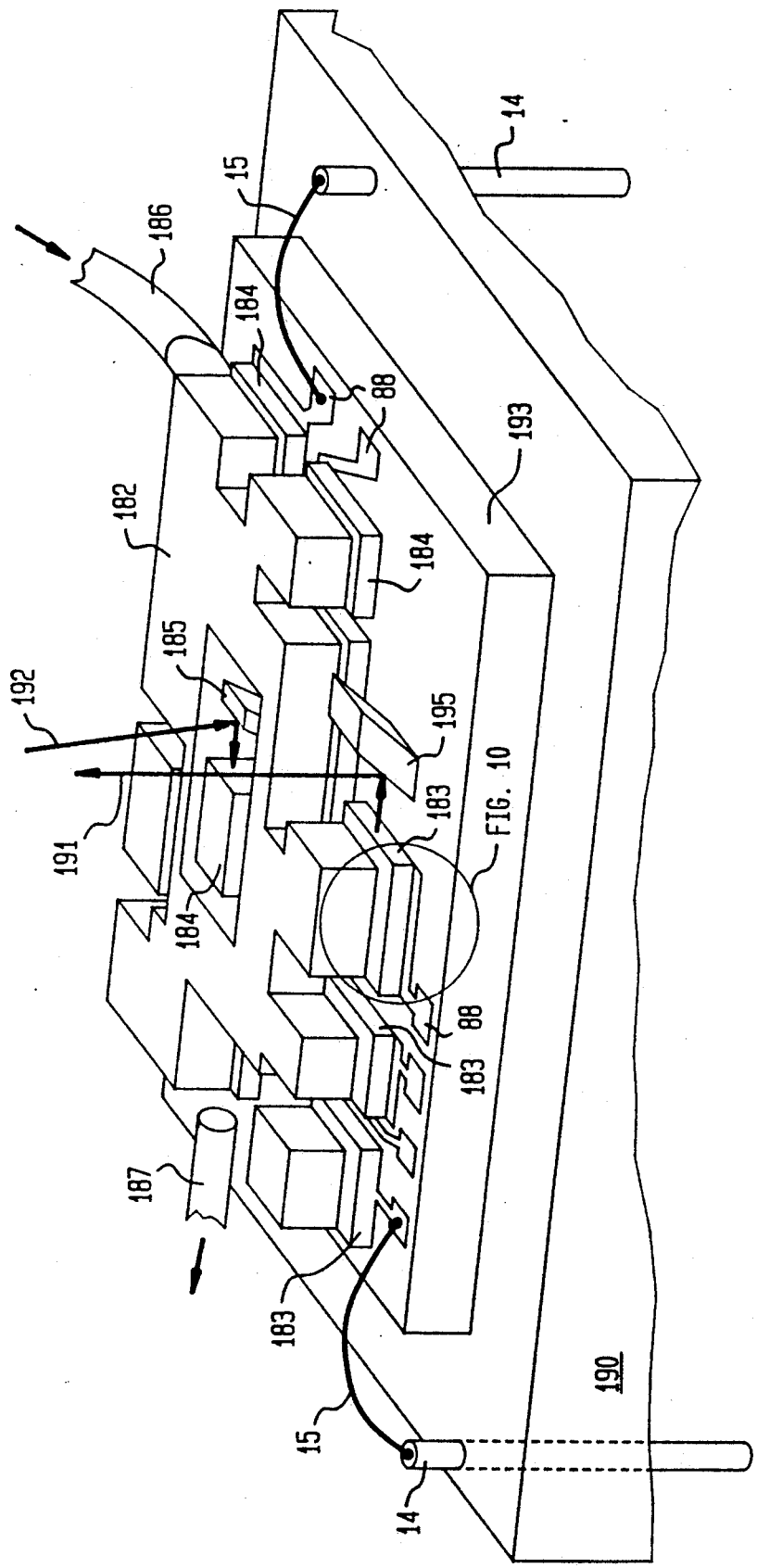
FIG. 9 is a schematic perspective view (not to scale) of chip with different input/output ports a fifth embodiment of the inventive cooling structure.

A fifth embodiment of the present invention is illustrated in FIG. 9, which shows a schematic perspective view of a LSLI chip (Large Scale Laser Integration) having mirrors with varied geometries on one wafer. In addition, two optical fibers 186 and 187, used as input/output ports, are connected to the chip. The inventive cooling structure allows the integration of lasers, photodetectors, and optical components on the same chip, some of them requiring optical input/output ports, in combination with effective upward heat transfer. FIG. 9 shows, with the vertical scale expanded for clarity, several opto-electronic elements integrated on a substrate 193, as there are laser diodes 183, and photo diodes (monitor diodes) 184. In addition, different optical input/output ports are shown. An input optical fiber 86, with sloping end is coupled to a photo diode 84, and a laser diode (not visible) emits a laser beam via an output optical fiber 87. One first mirror 185, is employed to couple light 192, into a photo diode 184, and another second mirror 195, deflects a laser beam 191, emitted by a laser diode 183, out of the device. Bonding pads 88, are situated on the substrate 193, such that bond wires 15, can be connected between these pads 88, and metal pins 14, be secured to a chip mounting structure 190. The cooling system of the described LSLI chip consists of a patterned heat transfer structure 182, which is formed on the devices integrated on the chip. The heat transfer bridge and heat sink are not shown in FIG. 9.

Figure 10:
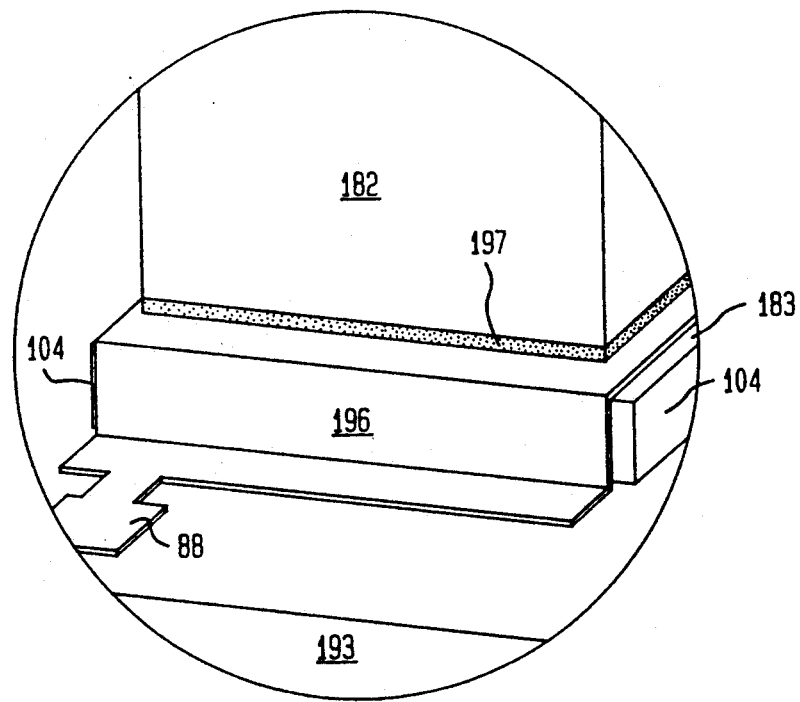
FIG. 10, is a detailed sketch of a part of FIG. 9, showing metallization of a laser.

FIG. 10, is a detailed sketch of a part of the fifth embodiment and shows a laser diode 183. A metal layer 196, covers the upper surface and a side wall of the laser diode 183, having etched mirror facets 104. The laser is partly covered by an dielectric passivation layer (e.g. $Al_2O_3$) such that the metal layer 196, is not directly formed on the side wall. The metal layer 196, is connected to a bonding pad 88. The heat transfer structure 182, grown on top of a plating base 197, is electrically connected to the pad 88. If no electrical connection between laser contacts, i.e. metal layer 196, and heat transfer structure 182, is needed, it is possible to form an insulation layer between laser contacts and heat transfer structure 182, as shown in FIG. 8.

The above described embodiments represent a number of different applications of the present invention. Depending on the requirements, several variations of the described embodiments are conceivable. Choosing different materials or fabrication techniques and/or adapting the described embodiments to other applications, results in additional embodiments of the present invention. The employment of materials with low or negligible thermal resistance and a minimization of the layer thickness allows optimized cooling structures.

If heat sources developing different amounts of heat are integrated on one chip and have to be cooled, it is conceivable to adapt the inventive cooling structure to this situation by forming thicker and thinner parts of the structure having different thermal resistances. Thermal coupling of single devices on one chip via heat bridges integrated in the cooling structure and thermal separation of devices on one chip by the employment of heat barriers are additional useful features for this invention.

The cooling structures of this invention are also applicable for SMD's (surface mounted device) technology.

While the present invention has been particularly described, in conjunction with specific preferred embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A cooling structure for direct heat transfer between at least one electronic element formed in an active layer of a semiconductor chip and at least one heat sink comprising:
   a) a current/voltage supply level formed on said active layer, said current/voltage supply level having at least one electrical current conductor as power supply line and/or signal line for said at least one electronic element, and further comprising at least one insulation spacer and/or layer electrically isolating said at least one electrical current conductor,
   b) an insulation layer covering at least a portion of said current/voltage supply level,
   c) means for heat transfer formed on top of at least a portion of said insulation layer and on at least a portion of exposed upper portions of said current/voltage supply level, said means for heat transfer thermally connecting to at least a portion of said current/voltage supply level and providing at least one thermal contact area, and d) at least one thermal bridge forming a thermal connection between said at least one thermal contact area and said at least one heat sink, wherein said current/voltage supply level, said insulation layer, said means for heat transfer, and said thermal bridge are arranged such that a low thermal resistance path is provided for directly transferring the heat developed in said at least one electronic elements via said at least one thermal bridge to said at least one heat sink.

2. The cooling structure of claim 1, wherein said electrical current conductor of said current/voltage supply level has bonding pads for connecting said electrical current conductor to at least one current/voltage connector.

3. The cooling structure of claim 1, wherein said electrical current conductor comprises of at least two metal layers.

4. The cooling structure of claim 1, wherein said electrical current conductor comprises of at least one plating base formed on top of said active layer, and at least one metal structure formed on top of said at least on plating base.

5. The cooling structure of claim 4, wherein said at least one metal structure formed on top of said at least one plating base is by electro-plating.

6. The cooling structure of claim 4, wherein said insulation spacers and/or layers electrically separating said at least one electrical current conductor is at least one photoresist.

7. The cooling structure of claim 1, wherein at least one of said electrical current conductor is formed on top of said active layer by metal deposition.

8. The cooling structure of claim 7, wherein said insulation spacers and/or layers electrically separating said at least one electrical current conductor is at least one polyimide.

9. The cooling structure of claim 1, wherein the top surface of said current/voltage supply level is substantially planar.

10. The cooling structure of claim 1, further comprising at least one window to provide access to at least one electronic or opto-electronic element that is situated on said semiconductor chip, and said at least one window further serves as an optical input/output port.

11. The cooling structure of claim 10, wherein mirrors are situated in at least one of said window for reflecting light, emitted from said at least one opto-electronic element, and/or for coupling light to said at least one opto-electronic element.

12. The cooling structure of claim 1, wherein said insulation spacers are gaps filled with at least one gas.

13. A chip package module for electronic or opto-electronic devices, comprising of a substrate, on which at least one semiconductor chip is mounted, and a metal cap used as heat sink, further comprising:
a) a cooling structure formed on top of said at least one semiconductor chip,
b) said cooling structure comprising of a current-/voltage supply level formed on an active layer of said semiconductor chip, said current/voltage supply level comprising of at least one electrical current conductor as power supply line and/or signal line for at least one electric element, and further comprising at least one insulation spacer and/or layer electrically isolating said at least one electrical current conductor,
c) an insulation layer covering at least a portion of said current/voltage supply level,
d) means for heat transfer formed on top of at least a portion of said insulation layer and on at least a portion of exposed upper portions of said current-/voltage supply level, said means for heat transfer thermally connecting to at least a portion of said current/voltage supply level and providing a least one thermal contact area, and
e) at least one thermal bridge forming a thermal connection between said at least one thermal contact area and said at least one heat sink, wherein said current/voltage supply level, said insulation layer, said means for heat transfer, and said thermal bridge are arranged such that a low thermal resistance path is provided for directly transferring the heat developed in said at least one electronic elements via said at least one thermal bridge to said at least one heat sink.

14. The chip package module of claim 13, wherein said electrical current conductor of said current/voltage supply level has bonding pads for connecting said electrical current conductor to at least one current-/voltage connector.

15. The chip package module of claim 13, wherein said electrical current conductor comprises of at least two metal layers.

16. The chip package module of claim 13, wherein said electrical current conductor comprises of at least one plating base formed on top of said active layer, and at least one metal structure formed on top of said at least one plating base.

17. The chip package module of claim 16, wherein said at least one metal structure formed on top of said at least one plating base is by electro-plating.

18. The chip package module of claim 16, wherein said insulation spacers and/or layers electrically separating said at least one electrical current conductor is at least one photoresist.

19. The chip package module of claim 13, wherein at least one of said electrical current conductor is formed on top of said active layer by metal deposition.

20. The chip package module of claim 19, wherein said insulation spacers and/or layers electrically separating said at least one electrical current conductor is at least one polyimide.

21. The chip package module of claim 13, wherein the top surface of said current/voltage supply level is substantially planar.

22. The chip package module of claim 13, further comprising at least one window to provide access to at least one electronic or opto-electronic element that is situated on said semiconductor chip, and said at least one window further serves as an optical input/output port.

23. The chip package module of claim 22, wherein mirrors are situated in at least one of said window for reflecting light, emitted from said at least one opto-electronic element, and/or for coupling light to said at least one opto-electronic element.

24. The chip package module of claim 13, wherein said insulation spacers are gaps filled with at least one gas.

* * * * *